US012266499B2

(12) United States Patent
Csato et al.

(10) Patent No.: US 12,266,499 B2
(45) Date of Patent: Apr. 1, 2025

(54) ENERGY FILTER FOR USE IN THE IMPLANTATION OF IONS INTO A SUBSTRATE

(71) Applicant: MI2-FACTORY GMBH, Jena (DE)

(72) Inventors: Constantin Csato, Stammbach (DE); Florian Krippendorf, Jena (DE)

(73) Assignee: MI2-FACTORY GMBH, Jena (DE)

( * ) Notice: Subject to any disclaimer, the term of this patent is extended or adjusted under 35 U.S.C. 154(b) by 262 days.

(21) Appl. No.: 17/631,186

(22) PCT Filed: Jul. 30, 2020

(86) PCT No.: PCT/EP2020/071559
§ 371 (c)(1),
(2) Date: Jan. 28, 2022

(87) PCT Pub. No.: WO2021/019038
PCT Pub. Date: Feb. 4, 2021

(65) Prior Publication Data
US 2022/0181114 A1   Jun. 9, 2022

(30) Foreign Application Priority Data
Jul. 31, 2019 (DE) ...................... 10 2019 120 623.5

(51) Int. Cl.
*H01J 37/05* (2006.01)
*G21K 1/10* (2006.01)
(52) U.S. Cl.
CPC ................ *H01J 37/05* (2013.01); *G21K 1/10* (2013.01)

(58) Field of Classification Search
CPC ................ H01J 2237/057; H01J 37/05; H01J 2237/0475; H01J 37/3171; H01J 37/04;
(Continued)

(56) References Cited

U.S. PATENT DOCUMENTS

| 11,183,358 | B2 | 11/2021 | Krippendorf |
| 2017/0352519 | A1* | 12/2017 | Rupp ...................... H01J 37/05 |
| 2019/0122850 | A1* | 4/2019 | Krippendorf .......... G21K 1/025 |

FOREIGN PATENT DOCUMENTS

| DE | 4338162 A1 | 5/1995 |
| DE | 102005019250 B3 | 9/2006 |

(Continued)

OTHER PUBLICATIONS

Written opinion of PCT/EP2020/071559, obtained from WIPO (Year: 2020).*

(Continued)

*Primary Examiner* — Michael J Logie
(74) *Attorney, Agent, or Firm* — LUCAS & MERCANTI, LLP

(57) ABSTRACT

The energy filter for use in the implantation of ions into a substrate is micropatterned for establishing, in the substrate, a dopant depth profile and/or defect depth profile brought about by the implantation, and has two or more layers or layer sections which are arranged one after another in the height direction of the energy filter. The energy filter also has a plurality of cavities each of which arranged between at least two layers or layer sections, with interior walls bounding the cavities and joining the at least two layers or layer sections to one another.

17 Claims, 9 Drawing Sheets

(58) Field of Classification Search
CPC ...... G21K 1/10; H05H 7/12; H05H 2007/125; H01L 21/046
See application file for complete search history.

(56) References Cited

FOREIGN PATENT DOCUMENTS

DE  102016106119 A1  10/2017
WO  WO-2017174597 A1 * 10/2017  ........... C23C 14/042

OTHER PUBLICATIONS

International Search Report Dated Oct. 26, 2020, 3 Pages.
Satoshi Iwamoto et al: "Semiconductor Three-Dimensional Photonic Crystals with Novel Layer-by-Layer Structures", Photonics, Bd. 3, Nr. 2, Jun. 1, 2016 (Jun. 1, 2016), Seite 34, XP055739078, DOI: 10.3390/photonics3020034, Seites 4-6.
Minghao Qi et al: "Fabrication of three-dimensional photonic crystals with midgap wavelength at 1.55 /spl mu/m", Quantum Electronics and Laser Science, 2003. QELS. Postconference Digest Jun. 1-6, 2003, Piscataway, NJ, USA,IEEE, Jun. 6, 2003 (Jun. 6, 2003), Seite 2pp, XP032414997, DOI: 10.1109/QELS.2003.238455 ISBN: 978-1-55752-749-3.
J. Bravo-Abad et al: "Enabling single-mode behavior over large areas with photonic Dirac cones", Proceedings of the National Academy of Sciences, Bd. 109, Nr. 25, Jun. 4, 2012 (Jun. 4, 2012), Seiten 9761-9765, XP055740128, ISSN: 0027-8424, DOI: 10.1073/pnas.1207335109 Seite 9761-Seite 9762; Abbildung 1.
Csato Constantin et al: "Energy filter for tailoring depth profiles in semiconductor doping application", Nuclear Instruments & Methods in Physics Research. Section B: Beam Interactions With Materials and Atoms, Bd. 365, Jul. 31, 2015 (Jul. 31, 2015), Seiten 182-186, XP029313812, ISSN: 0168-583X, DOI: 10.1016/J.NIMB.2015.07.102 Seite 182.
Toke Printz Ringb K et al: "Modulation power of porous materials and usage as ripple filter in particle therapy", Physics in Medicine and Biology, Institute of Physics Publishing, Bristol GB, Bd. 62, Nr. 7, Mar. 15, 2017 (Mar. 15, 2017), Seiten 2892-2909, XP020315175, ISSN: 0031-9155, DOI: 10.1088/1361-6560/AA5C28 [gefunden am Mar. 15, 2017] Zusammenfassung.
"Abstracts DEGRO 2018", Strahlentherapie Und Onkologie, Urban Und Vogel, Muenchen, DE, Bd. 194, Nr. 1, May 17, 2018 (May 17, 2018), Seiten 1-222, XP036729610, ISSN: 0179-7158, DOI: 10.1007/S00066-018-1301-7 [gefunden am May 17, 2018] Seite S208-Seite S209.

* cited by examiner

ENERGY FILTER FOR USE IN THE IMPLANTATION OF IONS INTO A SUBSTRATE

CROSS-REFERENCE TO RELATED APPLICATIONS

The present application is a 371 of International application PCT/EP2020/071559, filed Jul. 30, 2020, which claims priority of DE 10 2019 120 623.5, filed Jul. 31, 2019, the priority of these applications is hereby claimed, and these applications are incorporated herein by reference.

BACKGROUND OF THE INVENTION

The invention relates to an energy filter for use in the implantation of ions into a substrate.

Micropatterned energy filters of this kind are passed through by the beam of ions before it reaches the substrate, and serve to establish, in the substrate, a dopant depth profile brought about by the implantation.

One such energy filter is described in DE 10 2016 106 119 A1, for example. It is designed typically as a micropatterned membrane, which on an outer surface is provided with a predetermined geometric profile. The energy filter may also consist of two or more layers.

Problems with such energy filters include the mechanical susceptibility of the membrane or the need for a relatively thick supporting layer, which in turn, on account of its deceleration properties, necessitates an often unwanted increase in the primary ion energy.

SUMMARY OF THE INVENTION

It is an object of the present invention to provide an energy filter which shows increased mechanical stability and can therefore be given a design of large surface area, said energy filter also being suitable for use for low-energy primary ion beams and enabling a uniform and high-precision dopant depth distribution in the substrate.

In accordance with an aspect of the invention, the energy filter for use in the implantation of ions into a substrate is micropatterned for establishing, in the substrate, a dopant depth profile and/or defect depth profile brought about by the implantation, and has two or more layers or layer sections which are arranged one after another in the height direction of the energy filter. The energy filter also has a plurality of cavities which are arranged in each case between at least two layers or layer sections, with interior walls bounding the cavities and joining the at least two layers or layer sections to one another.

In this way an energy filter is provided which operates with the minimum primary ion energy needed for a target doping profile, and which has an improved mechanical stability. For the latter reason, the energy filter may also have a greater surface area than conventionally and can therefore be used for larger substrate diameters.

Two layers outwardly bounding the energy filter are preferably substantially continuous in design. This prevents extensive contamination of the substrate by material removed by sputtering in the energy filter.

Two layers outwardly bounding the energy filter are preferably substantially planar in design. Whereas dust and particles readily collect in a profiled surface, the flat surface is relatively resistant to soiling.

In a preferred embodiment, the distance between two successive layers or layer sections is between 100 nm and 5 mm, preferably between 200 nm and 50 µm.

In a preferred embodiment, the thickness of a layer or layer section is between 50 nm and 5 µm, preferably between 100 nm and 3 µm.

In a preferred embodiment, the thickness of an interior wall is between 0.5 and 500 µm, preferably between 2 and 100 µm.

The energy filter preferably has a multiplicity of individual cells which have in each case a cavity and at least two interior walls. In this way a desired doping profile can be established with particular accuracy.

The individual cells are preferably in a honeycomb-like arrangement.

In the case of a plurality of individual cells, the ratio of a maximum lateral extension of the individual cell in a length and/or width direction of the energy filter to an extension of the interior walls of the individual cell in the height direction of the energy filter is preferably between 1:2 and 1:12, more preferably between 1:4 and 1:10. In this way the individual cells act simultaneously as an integrated collimator structure.

The energy filter preferably has a plurality of columnar structural elements which are arranged adjacent to one another and extend over the entire height of the energy filter, with a plurality of the columnar structural elements comprising in each case a plurality of layer sections arranged one after another in the height direction of the energy filter.

More preferably, a plurality of the columnar structural elements have in each case a plurality of individual cells arranged one after another in the height direction of the energy filter.

The structural elements, which are able to define a defined discrete transmitted ion energy, fundamentally have lateral dimensions of between 500 nm and 500 µm.

The lateral extension of a structural element arrangement which contains all of the required energy-modulating structural elements for a given target depth profile lies between 5 µm and 30 mm in its lateral dimensions.

The energy filter has a thickness preferably of between 3 µm and 5 cm, more preferably between 5 µm and 300 µm, and particularly preferably between 50 µm and 200 µm.

The energy filter preferably possesses a length and width of between 2 cm and 50 cm.

The energy filter may also have a plurality of filled cells. This serves to increase the deceleration capacity.

A plurality of the interior walls may be arranged perpendicularly to the layers or layer sections.

A plurality of the interior walls may also be disposed obliquely to the layers or layer sections. In this case, the interior walls as well serve for deceleration, just like the layers or layer sections.

DETAILED DESCRIPTION OF SPECIFIC EMBODIMENTS

Figure 1:
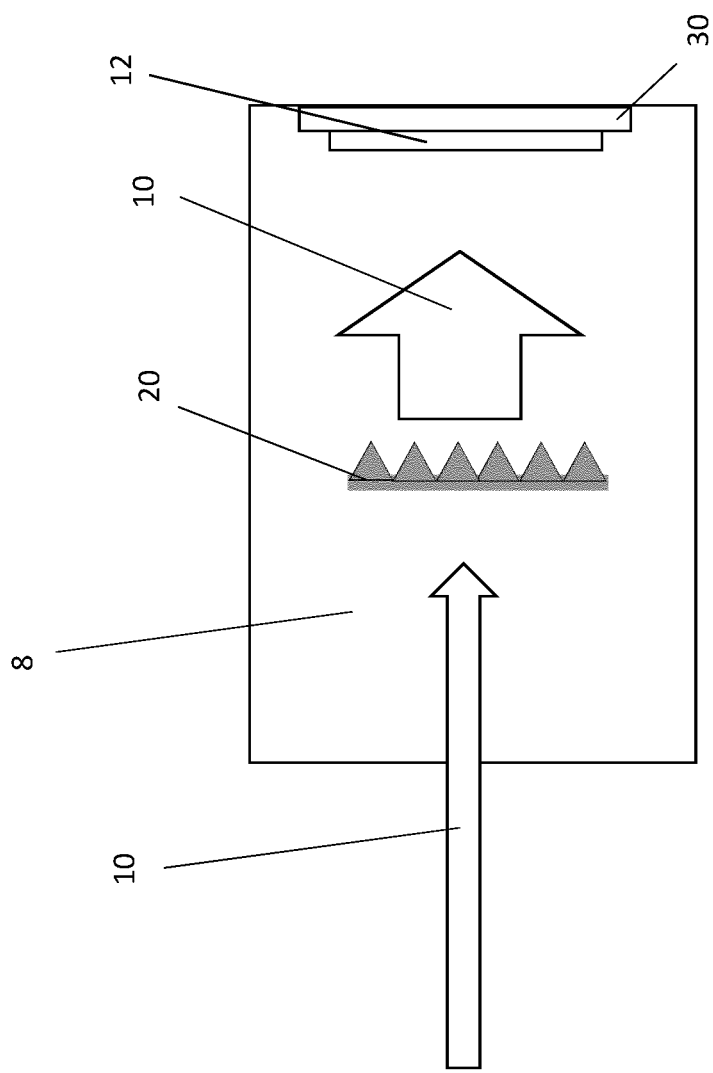
FIG. 1 is a schematic view of the operating principle of ion implantation into a substrate, using an energy filter.

In FIG. 1 the operating principle of ion implantation into a substrate 12 using an energy filter 20 is represented schematically. The setup shown in FIG. 1 for ion implantation into a substrate 12 shows an irradiation chamber 8, in which there is typically a high vacuum. In the irradiation chamber 8, the substrate 12 to be doped is accommodated in a substrate mount 30.

The material of the substrate 12 is preferably silicon carbide (SiC). However, other materials are also suitable, such as silicon, gallium arsenide, cadmium telluride, zinc selenide, gallium nitride, plastics, glass or insulators (diamond), etc. The substrates 12 are preferably configured as wafers. The substrates 12 typically possess a thickness of 4 µm to 5 mm.

An ion beam 10 is generated by means of a particle accelerator (not depicted) and passed into the irradiation chamber 8. The energy of the ion beam 10 is spread there by an energy filter 20, and the ion beam impinges on the substrate 12 for irradiation. Alternatively, the energy filter 20 may be arranged in a separate vacuum chamber, which is sealable using valves, within the irradiation chamber 8 or directly bordering the irradiation chamber 8.

The substrate mount 30 need not be stationary, but may instead be provided optionally with a means for displacing the substrate 12 in x-y (in the plane perpendicular to the sheet plane). Also coming into consideration as a substrate mount 30, moreover, is a wafer wheel, on which the substrates 12 for implantation are secured, said wheel rotating during implantation. Displacement of the substrate mount 30 in the beam direction (z-direction) may also be possible. Additionally, the substrate mount 30 may be provided optionally with cooling.

Figure 2:
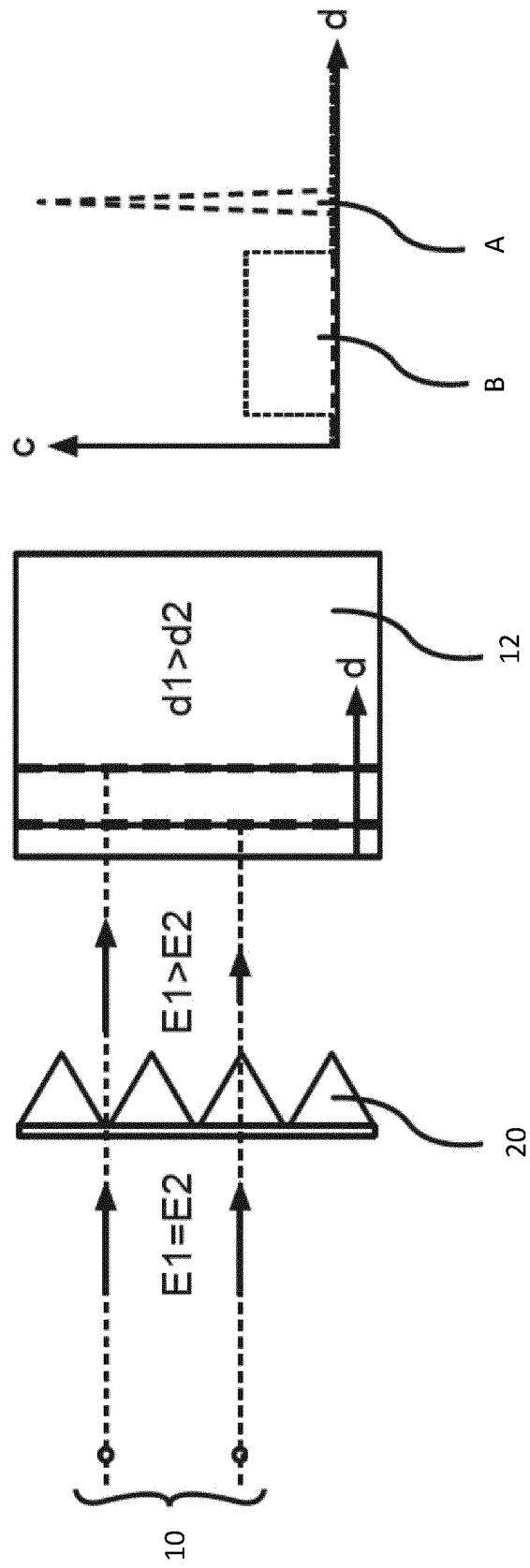
FIG. 2 is a schematic representation of the mode of operation of an energy filter.

The basic principle of the energy filter 20 is depicted in FIG. 2. The monoenergetic ion beam 10 is modified in its energy depending on the entry location as it passes through the micropatterned energy filter 20. The resulting energy distribution of the ions of the ion beam 10 results in modification of the depth profile of the implanted substance in the matrix of the substrate 12. E1 denotes the energy of a first ion, E2 denotes the energy of a second ion, c denotes the doping concentration, and d denotes the depth in the substrate 12. On the right in the diagram, the customary Gaussian distribution is labelled with reference symbol A, this being the distribution which comes about when no energy filter 20 is used. Drawn in conversely, by way of illustration with reference symbol B, is a rectangular distribution which is achievable when using an energy filter 20.

Figure 3:
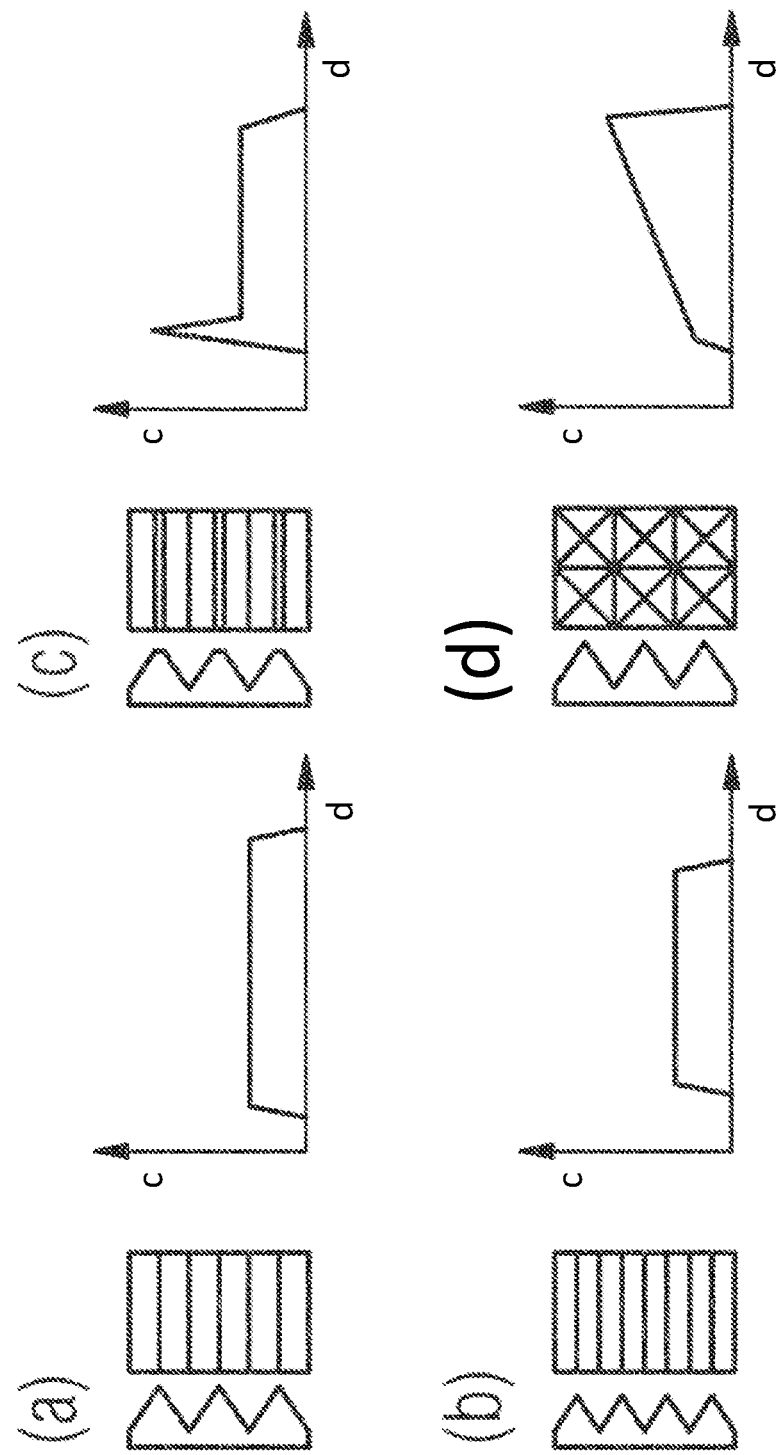
FIG. 3 is a schematic representation of various doping profiles which can be generated by means of energy filters with different patterning.

The layouts or three-dimensional structures of energy filters 20 that are shown in FIG. 3 show the theoretical possibilities for generating a multiplicity of dopant depth profiles or defect depth profiles using energy filter 20. Again, c denotes the doping concentration, and again d denotes the depth in the substrate 12. The filter structure profiles can in principle be combined with one another in order to obtain new filter structure profiles and hence new dopant depth profiles or defect depth profiles.

Energy filters 20 of the invention may be held in a filter frame (not shown). The filter frame may be accommodated replaceably in a filter mount (not shown).

Figure 4:
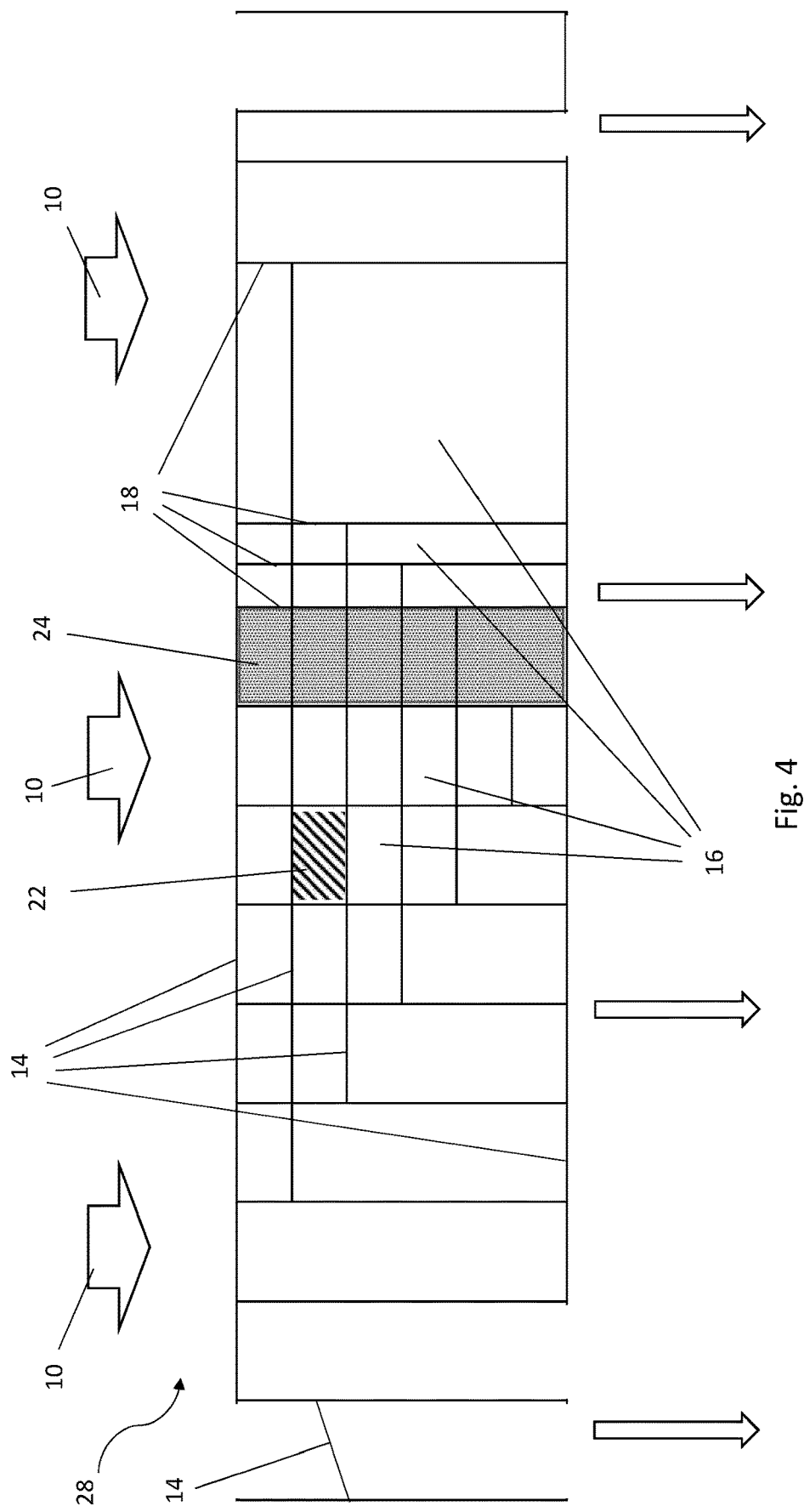
FIG. 4 is a schematic cross-sectional view of a detail of one embodiment of the energy filter of the invention.

FIG. 4 shows a detail of one embodiment of the energy filter 20 of the invention, in a schematic cross section. The depicted detail of the energy filter 20 is only a small detail of the overall structure.

The energy filter 20 has a multilaminar construction in the height direction, which corresponds preferably to the beam direction of the ion beam 10 as indicated by the arrows. For this purpose, the energy filter 20 has a plurality of layers or layer sections 14 which are arranged one after another in the height direction of the energy filter 20. The number of layers or layer sections 14 is between 2 and 100, preferably between 10 and 30.

It is possible for certain layers 14 to extend over the entire width and/or length of the energy filter 20, more particularly the two layers 14 which outwardly bound the energy filter 20 (in FIG. 4, the topmost and the bottommost layer 14). It is also preferred within the context of the invention for certain layers or layer sections 14 to extend only over subregions of the energy filter 20. These layers or layer sections 14 are primarily responsible for modulating the energy of the ion beam 10 in the energy filter 20.

The energy-modifying layers or layer sections 14 are preferably arranged parallel to one another. It may, however, also be the case that one energy-modifying layer 14 is not oriented parallel to other layers 14 (see on the left in FIG. 4).

Each layer or layer section 14 is preferably configured as a membrane. The materials of the layers or layer sections 14 may be identical or different. Suitable materials for the layers or layer sections 14 include, in particular, silicon, silicon carbide or carbon. Other materials too are conceivable. The layers or layer sections 14 are typically at a distance from one another in the height direction of the energy filter 20, though it is also possible for two or more layers or layer sections 14 to border one another directly.

The resulting energy distribution of a monoenergetic ion beam 10 downstream of the energy filter 20 is composed of discrete energies which correspond to the respective cumulative energy losses in the energy filter 20.

If two layers or layer sections 14 in succession in the height direction of the energy filter 20 are arranged with spacing from one another, a cavity 16 is formed between these layers or layer sections 14. In accordance with the invention, an energy filter 20 has a plurality of such cavities 16. Interior walls 18 bound the cavities 16 and connect in each case at least two layers or layer sections 14 to one another. In the exemplary embodiment depicted in FIG. 4, the interior walls 18 run parallel to the height direction of the energy filter 20, i.e., in the beam direction of the ion beam 10. It may be advantageous if these laterally bounding interior walls 18 between the individual cavities 16 of the energy filter 20 have a thickness such that ions are unable to pass through to adjacent cavities 16.

In contradistinction to the situation in conventional energy filters, both layers 14 outwardly bounding the energy filter 20 are substantially planar in design. In this case, the internal structure of the energy filter 20 is required on its own to ensure the desired energy modulation. It is, however, also possible for at least one of the two layers 14 outwardly bounding the energy filter 20 to have partial or complete profiling.

If the structure of the energy filter 20 according to an aspect of the invention were to be described in other words, the energy filter 20 has a multiplicity of individual cells 22 which comprise in each case a cavity 16 and at least two interior walls 18. In FIG. 4 an example of an individual cell 22 is depicted with hatching. If the energy filter 20 according to an aspect of the invention were to be described from a more functional standpoint, it consists of a multiplicity of columnar structural elements 24 arranged adjacent to one another and extending over the entire height of the energy filter 20. An example of a columnar structural element 24 is depicted with dots in FIG. 4. The majority of columnar structural elements 24 comprise in each case a plurality of layer sections 14 arranged one after another in the height direction of the energy filter 20. The number, the material and the thickness of the layer sections 14 through which the ion beam 10 will pass in the respective columnar structural element 24 define the energy loss of the ion beam in this microregion of the energy filter 20.

In other words, the majority, if not all, of the columnar structural elements 24 will comprise in each case a plurality of cavities 16 and a plurality of interior walls 18. Similarly, in general, a plurality of the columnar structural elements 24 will have in each case a multiplicity of individual cells 22 arranged one after another in the height direction of the energy filter 20.

All in all, there are virtually no limits on the architecture of the energy filter 20 in numerous respects. As already mentioned above, the layers or layer sections 14 may extend over the entire length and/or width of the energy filter 20, or over greater or lesser subregions thereof. Similarly, the interior walls 18 may extend in the height direction of the energy filter 20 over the entire height of the energy filter 20 or else only over subregions thereof. The result is a pattern of individual cells 22 each belonging to an individual columnar structural element 24, or else also possibly being extended comprehensively over two or more columnar structural elements 24.

In this way it becomes possible within the energy filter, through suitable patterning of the layers or layer sections 14 and also of the interior walls 18, to form an internal profile pattern of the energy filter 20 that yields the desired energy modulation of the ion beam 10.

In the embodiment depicted in FIG. 4, the resulting structure is substantially that of a stepped profile of the layers or layer sections 14 with a substantially triangular construction and with a peak in the structural element to the left of the structural element 24 drawn with dots. In this middle structural element 24, the ion beam 10 has to pass through the most layers or layer sections 14 in the height direction of the energy filter 20, and therefore loses the most energy. In the structural elements 24 arranged further to the side, the number of layers or layer sections 14 through which the ion beam 10 must pass in each case becomes smaller and smaller. Such triangle structures or other regular geometry structures may be generated almost infinitely through appropriate choice and arrangement of the layers and layer sections 14.

The structural elements 24 depicted in FIG. 4 together form a structural element arrangement 28. Such structural element arrangements 28 may be arranged multiply alongside one another, in periods in any desired way, in order to irradiate a large-surface-area substrate 12, for example, and together form the energy filter 20.

The designing of arbitrary depth profiles may be achieved by individual structural elements 24 occupying different extensions and therefore different two-dimensional extensions in relation to the overall surface area of the structural element arrangement 28. By this means, for each design it is possible for the resulting ion concentration of the penetration depth assigned to this ion energy in the substrate 12 to be designed in any desired form.

In the case of static use of energy filters 20 (substrate 12 and energy filter 20 are not moved) it is important to keep the extension of a structural element arrangement 28, which approximates the entire desired energy spectrum, sufficiently small in its lateral dimensions as to ensure a laterally homogenous depth distribution, owing to the scattering by the energy filter 20, on each area element of the substrate 12. The maximum possible dimensions of a structural element arrangement 28 in the case of static irradiation are a function of the ion energy, the ion type, and the distance between energy filter 20 and substrate 12.

As already mentioned above and apparent from FIG. 4, the width of the columnar structural elements 24 may vary. Similarly, each columnar structural element 24 may be covered outwardly by two bordering layers or layer sections 14, or, as apparent in the edge regions of FIG. 4, each element 24 may also be open to one side or to both sides.

It is particularly important to note that the depicted cross-sectional structure or a corresponding desired structure is likewise present in a direction perpendicular to the direction shown; in other words, the energy filter 20 forms a three-dimensional object which is micropatterned in both the length and the width directions.

Figure 5:
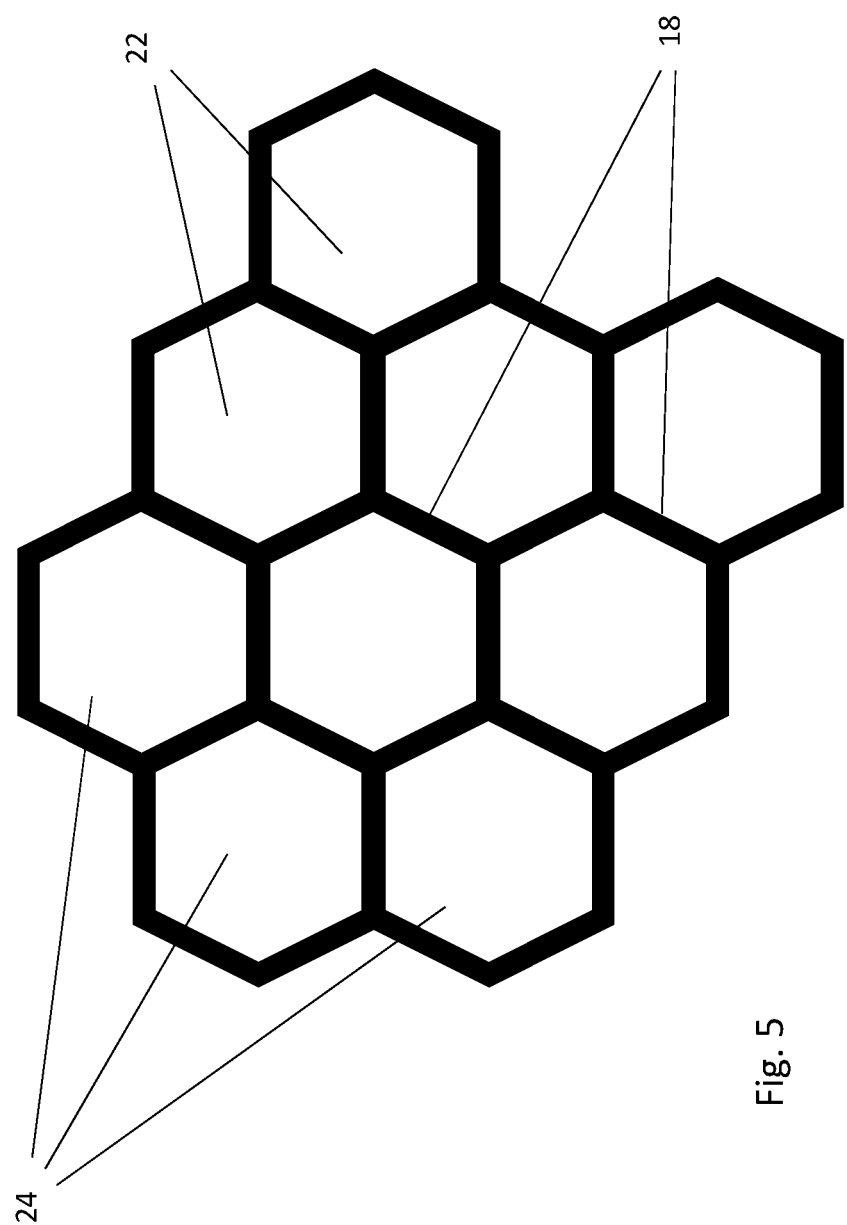
FIG. 5 is a schematic longitudinal-sectional view of a detail of one embodiment of the energy filter of the invention.
Figure 6:
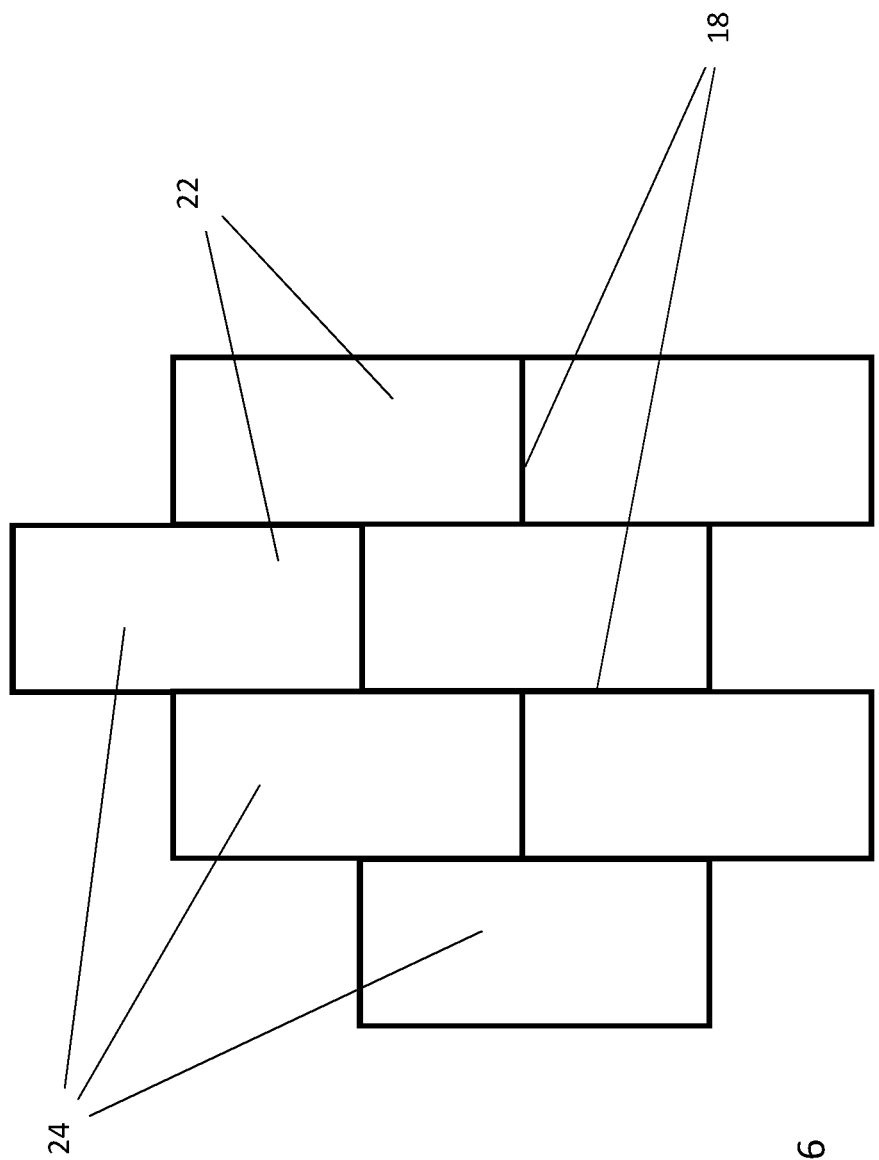
FIG. 6 is a schematic longitudinal-sectional view of a detail of an alternative embodiment of the energy filter of the invention.

FIGS. 5 and 6 show two illustrative possibilities for the arrangement of columnar structural elements 24 and, respectively, individual cells 22 in a longitudinal section (viewed from the direction of the arrows in FIG. 4 that indicate the ion beam 10). Preference is given to a honeycomb shape as in FIG. 5 or to a nested form of cross-sectionally rectangular structural elements 24 as in FIG. 6.

Figure 7:
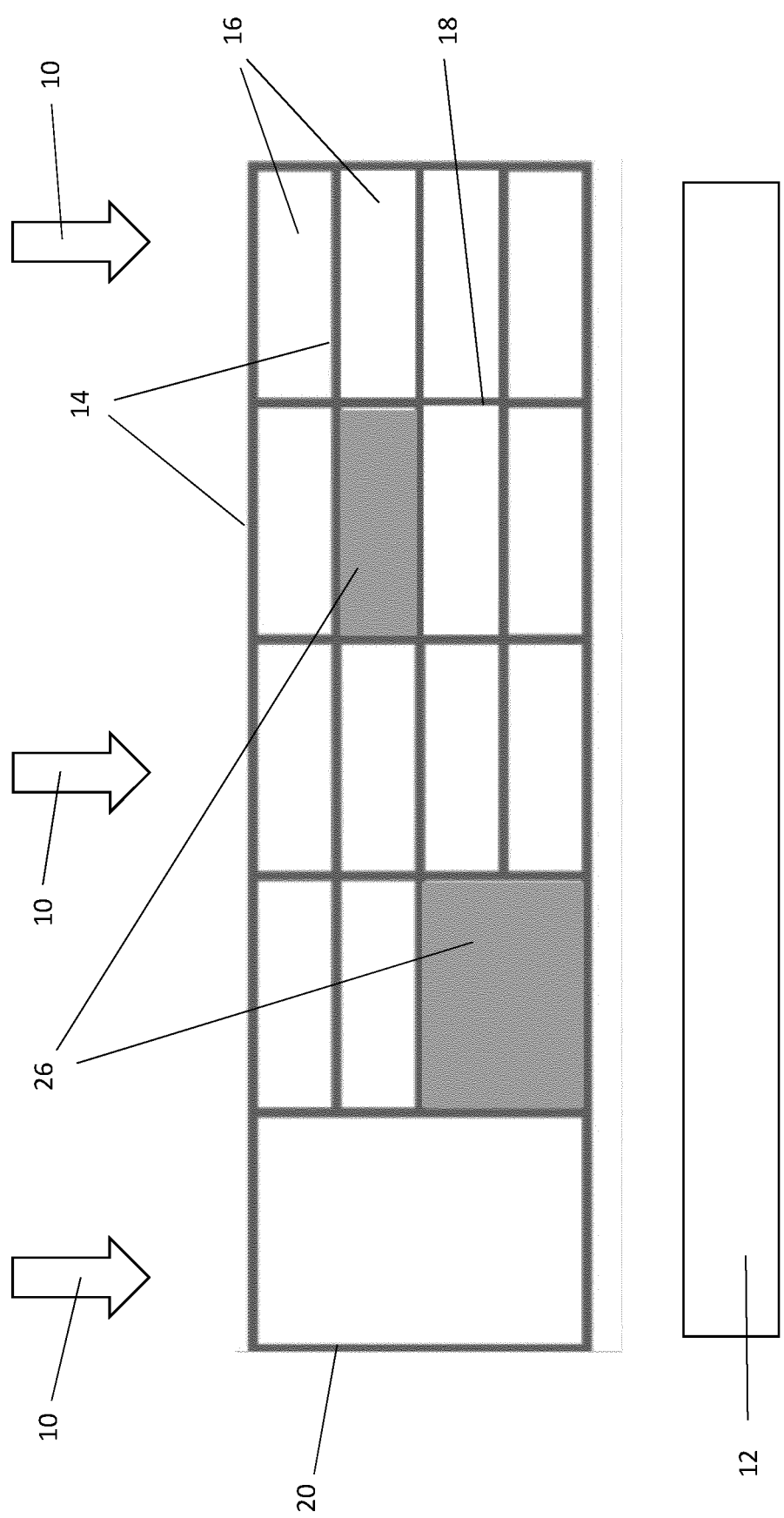
FIG. 7 is a schematic cross-sectional view of a detail of an alternative embodiment of the energy filter of the invention.

Shown in FIG. 7, moreover, is the fact that an energy filter 20 of the invention may also have filled cells 26, which may be distributed in a regular or irregular pattern in the energy filter 20. It is therefore possible to achieve greater deceleration capacity of the energy filter 20 in certain places. The material of the filled cells may be, for example, Si, SiC, C or diamond, with suitable oxides and nitrides, such as $SiO_2$, or plastics such as PMMA, and also ceramics or metals, being likewise suitable.

Figure 8:
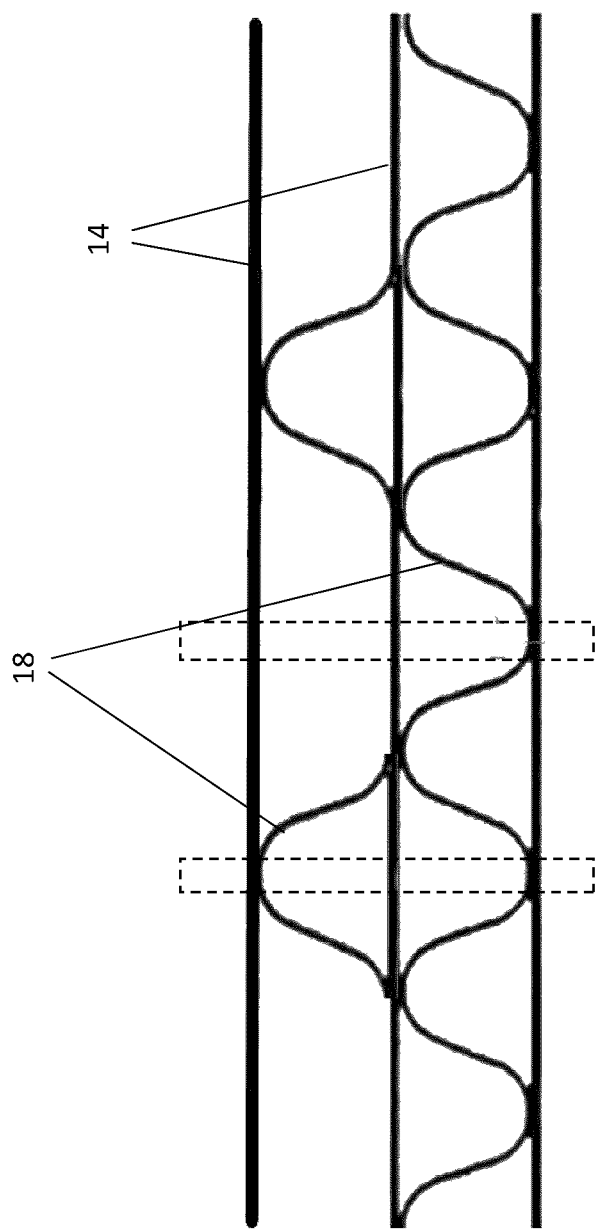
FIG. 8 is a schematic cross-sectional view of a detail of an alternative embodiment of the energy filter of the invention.

As is apparent from FIG. 8, it is also conceivable for the interior walls 18 to run not in the height direction of the energy filter 20 but instead obliquely thereto or, as depicted in FIG. 8, in a curved path between the adjacent layers or layer sections 14. In these cases, the interior walls 18 as well contribute to decelerating the ion beam 10.

In that case there are, in turn, regions of the energy filter 20 in which the ion beam 10 is required to pass through a greater number of layers or layer sections 14 and interior walls 18 (see the region on the left marked with dashes, in which the ion beam has to pass through five layers/layer sections/interior walls), and regions in which the ion beam has to pass through a smaller number of layers or layer sections 14 and interior walls 18 (see the region on the right marked with dashes, in which the ion beam has to pass through only four layers/layer sections/interior walls).

Figure 9:
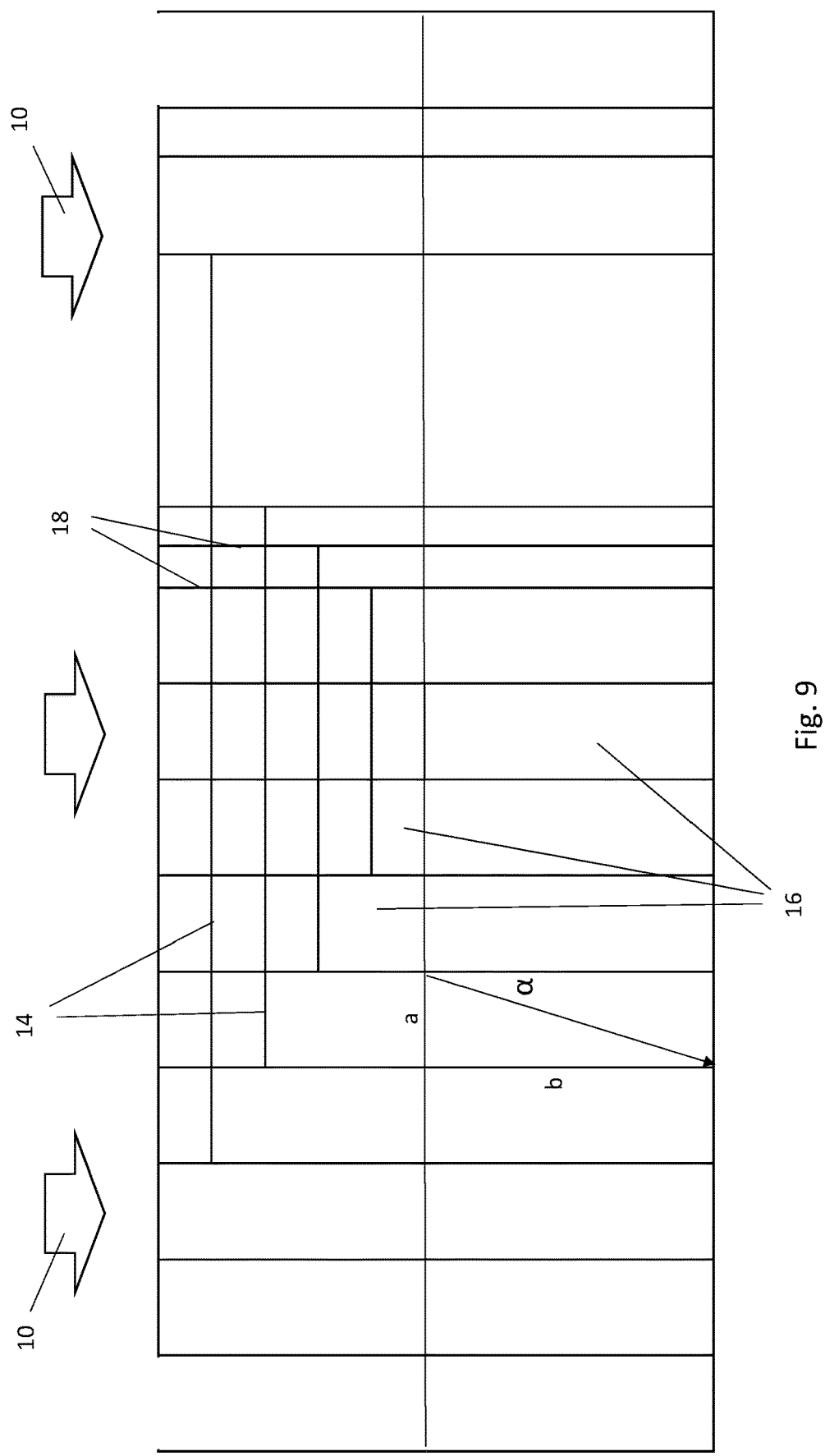
FIG. 9 is a schematic cross-sectional view of a detail of an alternative embodiment of the energy filter of the invention.

As depicted in FIG. 9, the energy filter 20 may also have an integrated collimator structure.

Depending on the primary energy on entry of ions into an energy-modulating layer or a layer section 14, there is a greater or lesser degree of scattering of the ions at this layer or layer section 14 and hence there is a widening of the angular distribution of the emerging ion beam in comparison to the incident primary ion beam 10. The reason for the energy dependence is that the microscopic deceleration mechanism in matter operates either via excitation of the electron system of the material (electronic deceleration) or via interatomic impacts with atoms in the layers (nuclear deceleration). Electronic deceleration has only a small scattering effect and is preferred at high ion energies. Nuclear deceleration has a high scattering effect and is preferred at low energies.

For the application of energy-filtered ions it is frequently desirable for the ions transmitted through the energy filter 20 to possess an extremely narrow angular distribution. For applications with masking, in particular, the angular distribution of the implanted ions is of critical importance.

The individual cells 22 in the energy filter 20 are designed such that they achieve a desired degree of focusing effect through the dimensioning of the aspect ratio (ratio of the maximum length or width to the height) of the cavity 16 between the energy-modifying layers or layer sections 14. The difference between focusing and "simple" individual cells 22 can be estimated from their aspect ratio:

Max. individual cell diameter:individual cell height>1:1, e.g. 5:1→no focusing element Max. individual cell diameter:individual cell height<1:1, e.g. 1:5→focusing element In accordance with an aspect of the invention, it is preferable if at least for a plurality of individual cells 22, the ratio of the maximum lateral extension a of the individual cell 22 in a length and/or width direction of the energy filter 20 to an extension b of the interior walls 18 of the individual cell 22 in the height direction of the energy filter 20 is between 1:2 and 1:12, preferably between 1:4 and 1:10. In this case, the focusing is relatively strong. An aspect ratio of this kind is present, for example, in the bottommost row of individual cells 22 in FIG. 9. In FIG. 9, the bottommost cavity 16 of each structural element 24 through which the ions have to travel has a vertical extension such as to result in a maximum angle α of the ions traveling through. This bottommost cavity 16, moreover, is closed off preferably by an energy-modulating layer 14.

An energy filter 20 of this kind may also be understood as a sequence of energy-modifying layers or layer sections 14 and focusing elements, or it may be referred to as an integrated energy filter and focusing apparatus.

The invention claimed is:

1. An implantation device for implantation of ions into a substrate, comprising an energy filter arranged in an ion beam path of the implantation device,
   the energy filter configured for establishing a dopant depth profile of the implanted ions in the substrate, and
   the energy filter having a plurality of layers or layer sections which are arranged one after another in an ion beam direction of the ion beam path, each of the plurality of layers or layer sections configured as a membrane, wherein two end layers of the plurality of layers or layer sections outwardly bound the energy filter on opposite sides of the energy filter in the ion beam direction and are continuous and planar in design,
   wherein the energy filter has a plurality of interior walls, each extending between and joining at least two of the plurality of layers or layer sections to one another, the plurality of interior walls and the plurality of layers or layer sections forming a plurality of cavities and each cavity of the plurality of cavities being formed in a spacing between two of the plurality of layers or layer sections and being surrounded by at least two of the plurality of layers or layer sections and at least two of the plurality of interior walls, and
   wherein the each cavity of the plurality of cavities is closed in the ion beam direction by the at least two of the plurality of layers or layer sections.

2. The implantation device of claim 1, wherein a distance between two successive layers or layer sections of the plurality of layers or layer sections is between 100 nm and 5 mm.

3. The implantation device of claim 1, wherein a distance between two successive layers or layer sections of the plurality of layers or layer sections is between 200 nm and 50 μm.

4. The implantation device of claim 1, wherein a thickness of at least one of the plurality of layers or layer sections is between 50 nm and 5 μm.

5. The implantation device of claim 1, wherein a thickness of at least one of the plurality of layers or layer sections is between 100 nm and 3 μm.

6. The implantation device of claim 1, wherein a thickness of at least one of the interior walls is between 0.5 and 500 μm.

7. The implantation device of claim 1, wherein a thickness of at least one of the interior walls is between 2 and 100 μm.

8. The implantation device of claim 1, wherein the energy filter has a plurality of individual cells each of which comprising one of the plurality of cavities and at least two of the interior walls.

9. The implantation device of claim 8, wherein the individual cells are arranged in a honeycomb-like structure.

10. The implantation device of claim 8, wherein a ratio of a maximum lateral extension of one of the individual cells in a length or width direction of the energy filter to an extension of the interior walls of the one of the individual cells in the height direction of the energy filter is between 1:2 and 1:12.

11. The implantation device of claim 1, wherein the energy filter has a plurality of columnar structural elements arranged adjacent to one another and extending over the entire height of the energy filter, with at least some of the columnar structural elements comprising in each case a plurality of the layer sections arranged one after another in the ion beam direction.

12. The implantation device of claim 11, wherein at least some of the plurality of columnar structural elements comprise in each case a plurality of the cavities and a plurality of the interior walls.

13. The implantation device of claim 11, wherein at least some of the plurality of columnar structural elements comprise in each case a plurality of individual cells arranged one after another in the ion beam direction, each of the individual cells comprising one of the plurality of cavities.

14. The implantation device of claim 1, wherein the energy filter has a plurality of filled cells.

15. The implantation device of claim 1, wherein a plurality of the interior walls are arranged perpendicularly to the plurality of layers or layer sections.

16. The implantation device of claim 1, wherein a plurality of the interior walls are arranged obliquely to the plurality of layers or layer sections.

17. The implantation device of claim 1, wherein the energy filter has a plurality of columnar structural elements arranged adjacent to each other, each columnar structural element of the plurality of columnar structural elements includes at least one cavity, the plurality of columnar structural elements defining a pattern of the cavities configured for establishing the dopant depth profile.

\* \* \* \* \*